(12) United States Patent
Torres

(10) Patent No.: US 7,115,500 B1
(45) Date of Patent: Oct. 3, 2006

(54) SYSTEM AND METHOD FOR PROVIDING A DRY-WET-DRY ETCH PROCEDURE TO CREATE A SIDEWALL PROFILE OF A VIA

(75) Inventor: Victor M. Torres, Irving, TX (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/958,539

(22) Filed: Oct. 4, 2004

(51) Int. Cl.
*H01L 21/31* (2006.01)
*H01L 21/469* (2006.01)

(52) U.S. Cl. ................ 438/637; 438/689; 438/743

(58) Field of Classification Search ............. 438/637, 438/653, 654, 655, 656, 689, 738, 740, 743, 438/744
See application file for complete search history.

(56) References Cited

U.S. PATENT DOCUMENTS 6,274,486 B1 * 8/2001 Rhodes et al. .............. 438/653

\* cited by examiner

*Primary Examiner*—Phuc T. Dang

(57) ABSTRACT

A system and method is disclosed for providing a dry-wet-dry etch procedure to create a sidewall profile of a via in a semiconductor device. A first vertical anisotropic dry etch process is applied to etch through a first portion of a dielectric layer. An isotropic wet etch process is then applied to etch a sloping surface in the sidewalls of the via cavity. A second vertical anisotropic dry etch process is then applied to extend the sloping sidewalls of the via cavity down to a substrate of the semiconductor device. The smooth sloping surfaces of the sidewalls are formed without a prior art concave surface of the type that interferes with a via fill process.

20 Claims, 4 Drawing Sheets

SYSTEM AND METHOD FOR PROVIDING A DRY-WET-DRY ETCH PROCEDURE TO CREATE A SIDEWALL PROFILE OF A VIA

TECHNICAL FIELD OF THE INVENTION

The present invention is generally directed to the manufacture of semiconductor circuits and, in particular, to a system and method for providing a dry-wet-dry etch procedure to create a sidewall profile of a via in a semiconductor circuit.

BACKGROUND OF THE INVENTION

When a semiconductor circuit is manufactured it is necessary to form a plurality of via cavities between individual layers of the semiconductor circuit in order to provide conduits for electrical communication between metal layers of the semiconductor circuit. In order to facilitate the efficient filling of the via cavities with metal fill material (e.g., aluminum) the sidewalls of the via cavities should have an appropriately shaped profile. That is, the shape of a via cavity should not interfere with a subsequent via fill process.

Prior art methods of forming a via cavity, however, often leave one or more sharp edges in the sidewall profile of the via cavity. Other prior art methods of forming a via cavity create via cavity sidewalls that have a concave profile. The presence of sharp edges or the presence of a concave profile in a via cavity sidewall tends to catch portions of the fill material and cause the fill process of via cavity to be incomplete. That is, voids in the fill material may be caused by the sharp edges in the sidewalls of the via cavity. Voids in the fill material may also be caused by the presence of a concave profile in the sidewalls of the via cavity.

Therefore, there is a need in the art for a system and method that is capable of providing a via cavity in a semiconductor circuit that has an optimally shaped sidewall profile. There is also a need in the art for a system and method that is capable of providing a via cavity having a sidewall profile that facilitates a subsequent via fill process.

SUMMARY OF THE INVENTION

To address the above-discussed deficiencies of the prior art, it is a primary object of the present invention to provide a system and method for providing a dry-wet-dry etch procedure to create a sidewall profile of a via in a semiconductor circuit.

In one advantageous embodiment of the present invention, a dry-wet-dry etch procedure is employed to create an optimally shaped sidewall profile of a via in a semiconductor device. A semiconductor device is provided that comprises a silicon substrate with an embedded first metal layer. The silicon substrate and the embedded first metal layer are covered with a dielectric layer. The dielectric layer is covered with a resist mask having portions that form an aperture through the resist mask.

A first vertical anisotropic dry etch process is applied to etch through a first portion of a dielectric layer. In one advantageous embodiment of the invention, the thickness of the first portion of the dielectric layer is approximately one half of the thickness of the dielectric layer. Then an isotropic wet etch process is applied to etch a sloping surface in the sidewalls of the via cavity. The isotropic wet etch process is applied for a period of time that is selected so that the amount of the dielectric layer that is removed by the lateral portion of said isotropic wet etch process allows the application of a subsequent second vertical anisotropic dry etch process to create smooth sidewalls for said via cavity. Then a second vertical anisotropic dry etch process is applied to extend the sloping sidewalls of the via cavity down to a substrate of the semiconductor device. The smooth sloping surfaces of the sidewalls of the via cavity are formed without prior art sharp edges and without a prior art concave surface of the type that interferes with a subsequent via fill process. The via cavity profile of the present invention improves the reactive wetting of aluminum for filling via cavities with aspect ratios greater than approximately one and two tenths (1.2).

It is an object of the present invention to provide a system and method for providing a dry-wet-dry etch procedure to create a sidewall profile of a via cavity in a semiconductor circuit.

It is also an object of the present invention to provide a system and method for providing a dry-wet-dry etch procedure to create a sidewall profile of a via cavity that does not have sharp edges in the sidewall profile.

It is yet another object of the present invention to provide a system and method for providing a dry-wet-dry etch procedure to create a sidewall profile of a via cavity that does not have a concave surface in the sidewall profile.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior uses, as well as future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts:

FIG. 1 illustrates a cross sectional view of a prior art integrated circuit device showing a dielectric layer covered with a resist mask having an aperture for etching a via cavity;

FIG. 2 illustrates a cross sectional view of the prior art integrated circuit device shown in FIG. 1 in which a first vertical anisotropic dry etch process has been applied to etch a via cavity through a first portion of the dielectric layer;

FIG. 3 illustrates a cross sectional view of the prior art integrated circuit device shown in FIG. 2 in which an isotropic wet etch process has been applied to widen the via cavity within the dielectric layer;

FIG. 4 illustrates a cross sectional view of the prior art integrated circuit device shown in FIG. 3 in which a second vertical anisotropic dry etch process has been applied to extend the via cavity down to a metal layer in a silicon substrate;

FIG. 5 illustrates a cross sectional view of the prior art integrated circuit device shown in FIG. 4 in which the resist mask has been removed;

FIG. 6 illustrates a cross sectional view of the prior art integrated circuit device shown in FIG. 5 on which a layer of metal has been deposited to partially fill the via cavity;

FIG. 7 illustrates a cross sectional view of the prior art integrated circuit device shown in FIG. 5 to which a sputter etch process has been applied to round off the sharp edges of the via cavity;

FIG. 9 illustrates a cross sectional view of an integrated circuit device of the present invention showing a dielectric layer covered with a resist mask having an aperture for etching a via cavity;

FIG. 10 illustrates a cross sectional view of the integrated circuit device shown in FIG. 9 in which a first vertical anisotropic dry etch process has been applied to etch a via cavity through a first portion of the dielectric layer;

FIG. 11 illustrates a cross sectional view of the integrated circuit device shown in FIG. 10 in which an isotropic wet etch process has been applied to widen the via cavity within the dielectric layer;

FIG. 12 illustrates a cross sectional view of the integrated circuit device shown in FIG. 11 in which a second vertical anisotropic dry etch process has been applied to extend the via cavity down to a metal layer in a silicon substrate;

DETAILED DESCRIPTION OF THE INVENTION

Figure 1:
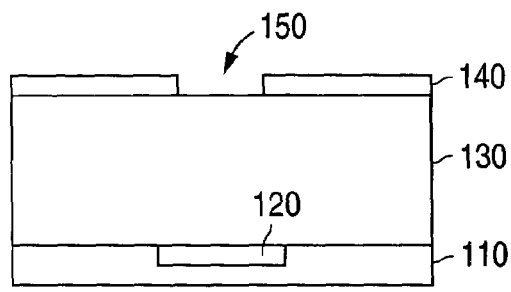
FIGS. 1 through 7 illustrate successive stages in the construction of a via in a prior art integrated circuit device.

FIGS. 1 through 14 and the various embodiments used to describe the principles of the present invention in this patent document are by way of illustration only and should not be construed in any way to limit the scope of the invention. Those skilled in the art will understand that the principles of the present invention may be implemented in any type of suitably arranged integrated circuit device.

To simplify the drawings the reference numerals from previous drawings will sometimes not be repeated for structures that have already been identified.

In order to better understand the principles of the present invention a description of the construction of an exemplary prior art via in an integrated circuit device will first be given. FIGS. 1 through 7 illustrate successive stages in the construction of a via in the exemplary prior art integrated circuit device.

The exemplary prior art integrated circuit device shown in FIG. 1 comprises a silicon substrate 110. An exemplary first metal layer 120 is embedded within silicon substrate 110. Silicon substrate 110 and first metal layer 120 are covered with a dielectric layer 130. Dielectric layer 130 is covered with resist mask 140. As shown in FIG. 1, resist mask 140 has an aperture 150 located with resist mask 140 for etching a via cavity down through the dielectric layer 130.

Figure 2:
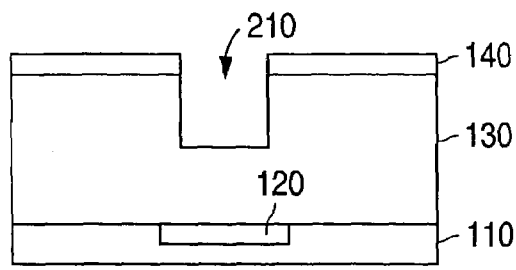

In the next step of the exemplary prior art method a first vertical anisotropic dry etch process is applied to etch a via cavity 210 through the top portion of the dielectric layer 130. The result of applying the first vertical anisotropic dry etch process is shown in FIG. 2. In the example shown in FIG. 2 approximately one half of the thickness of the dielectric layer 130 is etched away by the first vertical anisotropic dry etch process.

Figure 3:
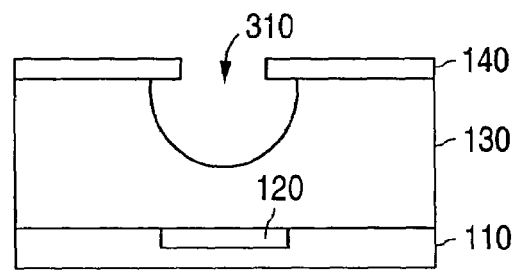

In the next step of the exemplary prior art method an isotropic wet etch process is applied to widen the via cavity 210 within the dielectric layer 130. The result of applying the isotropic wet etch process is shown in FIG. 3. The widened via cavity is designated with reference numeral 310 in FIG. 3.

Figure 4:
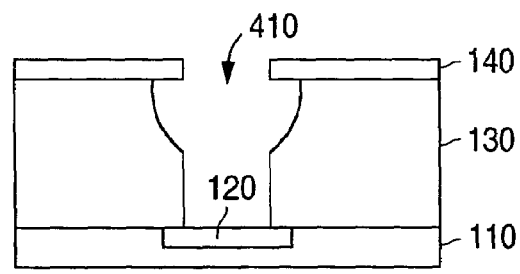

In the next step of the exemplary prior art method a second vertical anisotropic dry etch process is then applied to extend the via cavity 310 down to first metal layer 120 in silicon substrate 110. The result of applying the second vertical anisotropic dry etch process is shown in FIG. 4. The extended via cavity is designated with reference numeral 410 in FIG. 4.

Figure 5:
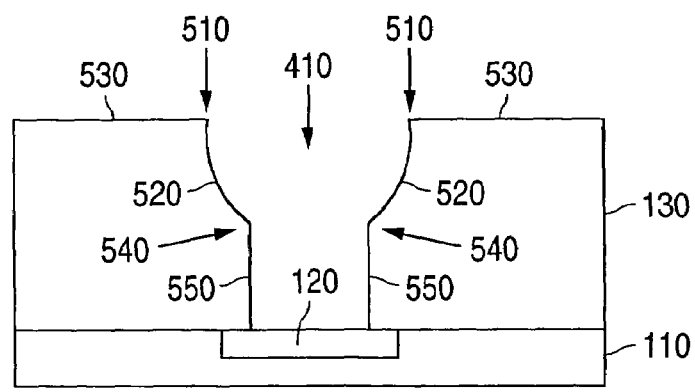

In the next step of the exemplary prior art method the resist mask 140 is then removed. FIG. 5 illustrates a cross sectional view of the prior art integrated circuit device shown in FIG. 4 in which the resist mask 140 has been removed. The etched portions of the dielectric layer 130 shown in FIG. 5 have sharp corners. In particular, there is a first sharp corner 510 located at the juncture where the curved surface 520 of the dielectric layer 130 meets the top layer 530 of dielectric layer 130. Because the via cavity 410 has cylindrical symmetry (and because FIG. 5 is a cross sectional view) the sharp corner 510 is shown in two locations in FIG. 5.

Similarly, there is a second sharp corner 540 located at the juncture where the curved surface 520 of the dielectric layer 130 meets the vertical walls 550 of via cavity 410. Because the via cavity 410 has cylindrical symmetry (and because FIG. 5 is a cross sectional view) the sharp corner 540 is shown in two locations in FIG. 5. The presence of the curved surface 520 in the dielectric layer 130 between the two sharp corners 510 and 540 gives the top portion of via cavity 410 a "wine glass" shape.

Figure 6:
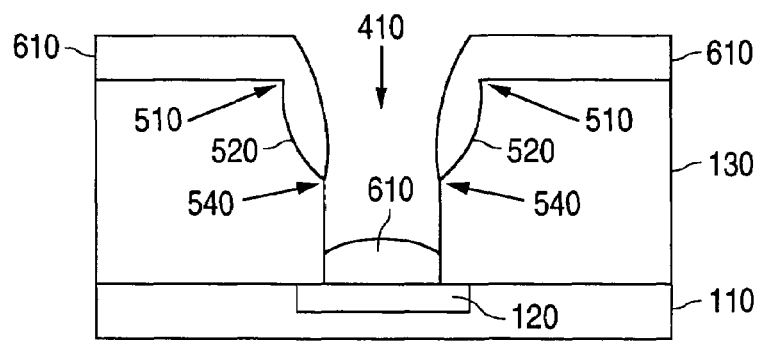

When the via cavity 410 is subsequently filled with aluminum the presence of the sharp corners 510 and 540 may interfere with the diffusion of aluminum into the via cavity 410. This may result in an incomplete fill of the via cavity 410. FIG. 6 illustrates a cross sectional view of the prior art integrated circuit device shown in FIG. 5 on which a second metal 610 has been deposited (e.g., diffused aluminum). As shown in FIG. 6, the second metal 610 covers the top portions 530 of the dielectric layer 130 and partially fills the via cavity 410. The curved surface 520 between sharp corner 510 and sharp corner 540 forms a concave profile at the top of the via cavity 410.

This concave profile tends to retain portions of the aluminum fill material and cause the aluminum fill process of via cavity 410 to be incomplete. That is, voids may be created in the second metal layer 610. In the example shown in FIG. 6, the portions of the second metal layer 610 that have been deposited on the first metal layer 120 are not electrically connected to the other portions of the second metal layer 610.

Figure 7:
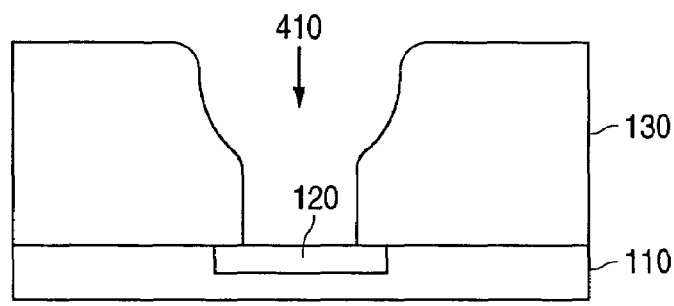

There have been some prior art attempts to remove the sharp corners 510 and 540. For example, in U.S. Pat. No. 5,453,403 issued to Meng et al. on Sep. 26, 1995, an Argon sputter etch process is applied to the dielectric layer in order to "smooth the sharp edges." The result of applying such a process to the device shown in FIG. 5 is shown in FIG. 7. The sharp edges 510 and 540 have been removed from the via cavity 410 by rounding off the edges.

The Meng et al. process provides some improvement. Although it smoothes the sharp edges considerably, the process does not completely remove the concave profile that is created by the dry-wet-dry etch process. That is, a concave surface still remains within the sidewall of the via cavity 410. This may be seen with reference to the photograph shown in FIG. 8.

Figure 8:
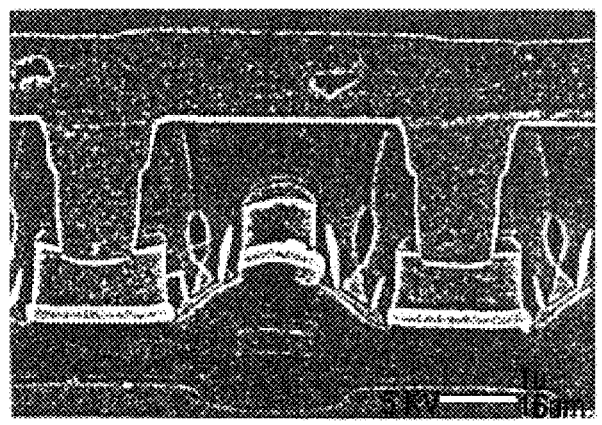
FIG. 8 illustrates a scanning electron micrograph of a cross section of a prior art integrated circuit device having a via cavity of the type illustrated in FIG. 7.

FIG. 8 illustrates a scanning electron micrograph of a cross section of a prior art integrated circuit device having a via cavity 410 of the type illustrated in FIG. 7. There are two filled vias shown in FIG. 8. Each of the vias has a concave surface within the sidewall of the via cavity. The presence of this concave surface interferes with the reactive wetting of aluminum that is critical to filling the via cavities for aspect ratios that are greater than one and two tenths (1.2).

The present invention provides a via cavity that does not have a concave surface within the sidewall of the via cavity. In addition, the present invention does not require an additional step (such as an Argon sputter etch process) in order to smooth the sharp edges of the walls of the via cavity.

A description of the construction of an exemplary via in an integrated circuit device in accordance with the principles of the present invention will now be given. FIGS. 9 through 12 illustrate successive stages in the construction of a via in an integrated circuit device in accordance with the principles of the present invention.

Figure 9:
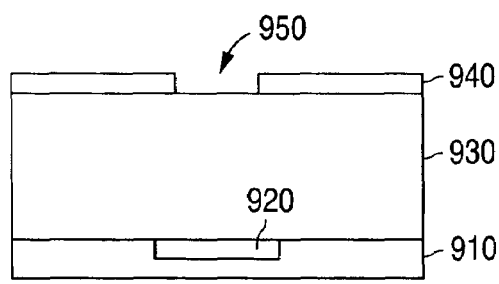
FIGS. 9 through 12 illustrate successive stages in the construction of a via in an integrated circuit device in accordance with the principles of the present invention.

The exemplary integrated circuit device of the present invention shown in FIG. 9 comprises a silicon substrate 910. An exemplary first metal layer 920 is embedded within silicon substrate 910. Silicon substrate 910 and first metal layer 920 are covered with a dielectric layer 930. Dielectric layer 930 may comprise silicon dioxide material. Dielectric layer 930 may have a thickness of at least ten thousand Angstroms (10,000 Å). Dielectric layer 930 is covered with resist mask 940. As shown in FIG. 9, resist mask 940 has an aperture 950 located within resist mask 940 for etching a via cavity down through the dielectric layer 930.

Figure 10:
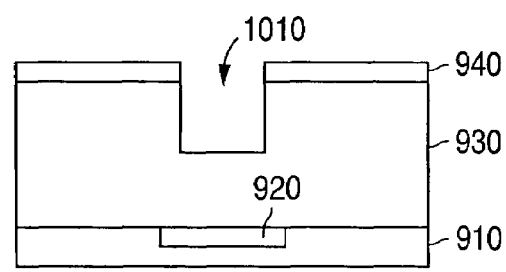

In the next step of the exemplary method of the present invention a first vertical anisotropic dry etch process is applied to etch a via cavity 1010 through the top portion of the dielectric layer 930. The result of applying the first vertical anisotropic dry etch process is shown in FIG. 10. In the example shown in FIG. 10 approximately one half of the thickness of the dielectric layer 930 is etched away by the first vertical anisotropic dry etch process.

In the next step of the exemplary method of the present invention an isotropic wet etch process is applied to widen the via cavity 1010 within the dielectric layer 930. The isotropic wet etch process of the present invention is applied for a relatively short amount of time compared to the wet etch times of prior art methods. For example, in one advantageous embodiment of the invention, the isotropic wet etch process is applied for approximately forty seconds. This means that the lateral etching of via cavity 1010 occurs only for a comparatively limited amount of time.

Figure 11:
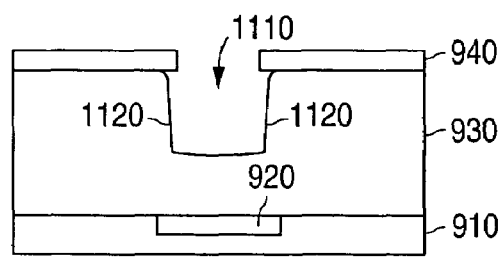

The isotropic wet etch process etches the dielectric layer 930 both vertically and laterally. The amount of time that the isotropic wet etch process is applied is selected so that the amount of the dielectric layer 930 that is removed by the lateral portion of the wet etch process will allow the application of a subsequent second vertical anisotropic dry etch process to create smooth sidewalls for the via cavity. The result of applying the isotropic wet etch process is shown in FIG. 11. The widened via cavity is designated with reference numeral 1110 in FIG. 11. The sidewalls 1120 of via cavity 1110 extend downwardly with a slight slope toward the bottom of via cavity 1110.

Figure 12:
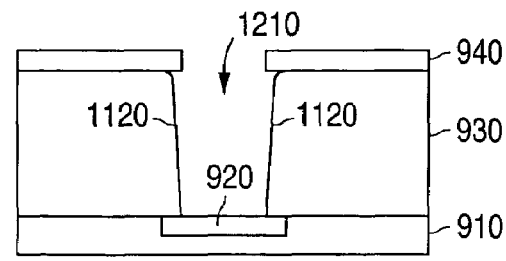

In the next step of the exemplary method of the present invention a second vertical anisotropic dry etch process is then applied to extend the via cavity 1110 down to first metal layer 920 in silicon substrate 910. The second vertical anisotropic dry etch process extends the sidewalls 1120 down to the first metal layer 920. There is a smooth continuous surface on the sidewalls 1120. That is, unlike prior art via structures there is no discontinuous "lip" or "edge" or "concave surface" present in the sidewalls 1120. The result of applying the second vertical anisotropic dry etch process is shown in FIG. 12. The extended via cavity is designated with reference numeral 1210 in FIG. 12. In the next step of the exemplary method of the present invention the resist mask 940 is then removed. A conventional aluminum fill process is then employed to fill via cavity 1210. The result of the aluminum fill process is shown for a single via in FIG. 13.

Figure 13:
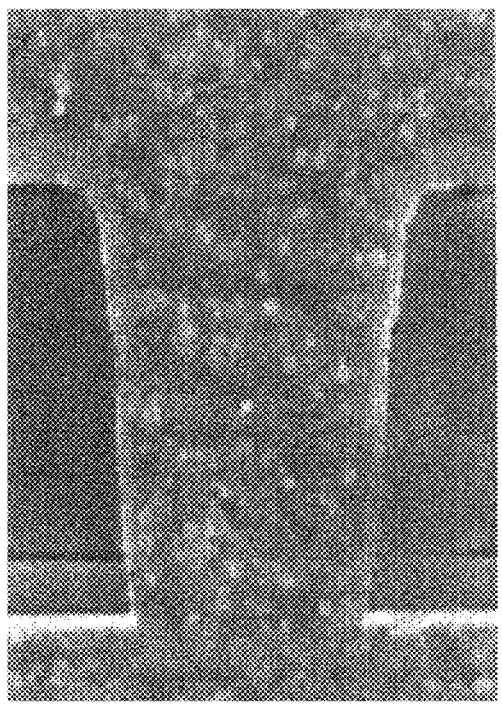
FIG. 13 illustrates a scanning electron micrograph of a cross section of an integrated circuit device having a via cavity of the present invention of the type shown in FIG. 12.

FIG. 13 illustrates a scanning electron micrograph of a cross section of an integrated circuit device having a via cavity 1210 of the present invention of the type shown in FIG. 12. The via shown in FIG. 13 has no concave surface within the sidewalls of the via cavity. The sidewalls of the via cavity are substantially smooth. The absence of a concave surface within the sidewall of the via cavity means that there will be no interference with the reactive wetting of aluminum in the via cavity. This minimizes the possibility that voids will form during the application of an aluminum fill process.

Figure 14:
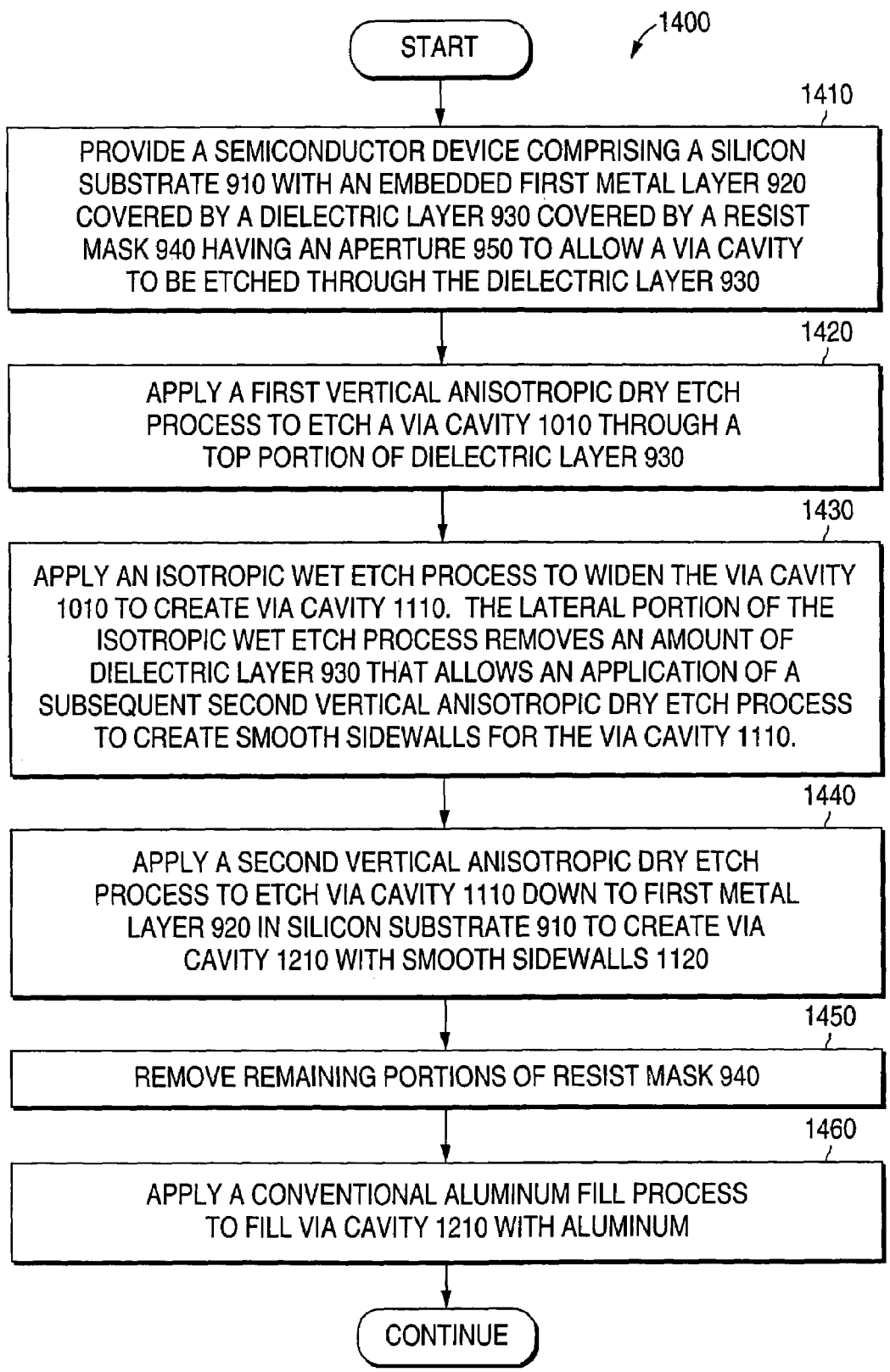
FIG. 14 illustrates a flow chart showing the steps of an advantageous embodiment of the method of the present invention.

FIG. 14 illustrates a flow chart 1400 showing the steps of an advantageous embodiment of the method of the present invention. First a semiconductor device is provided of the type that comprises a silicon substrate 110 with an embedded first metal layer 920 covered by a dielectric layer 930. The dielectric layer 930 is covered by a resist mask 940 that has an aperture 950 to allow a via cavity to be etched through the dielectric layer 930 (step 1410). Then a first vertical anisotropic dry etch process is apply to etch a via cavity 1010 through a top portion of the dielectric layer 930 (step 1420).

Then an isotropic wet etch process is applied to widen the via cavity 1010 to create a via cavity 1110 (step 1430). The isotropic wet etch process is applied for a period of time selected so that the amount of dielectric layer 930 that is removed by the lateral portion of the wet etch process will allow the application of a subsequent second vertical anisotropic dry etch process to create smooth sidewalls for the via cavity 1110. Then a second vertical anisotropic dry etch process is applied to etch via cavity 1110 down to first metal layer 920 in silicon substrate 910 to create a via cavity 1210 with smooth sidewalls 1120 (step 1440). Then the remaining portions of the resist mask 940 are removed (step 1450). Then a conventional aluminum fill process is applied to fill via cavity 1210 with aluminum (step 1460).

Although the present invention has been described with an exemplary embodiment, various changes and modifications may be suggested to one skilled in the art. It is intended that the present invention encompass such changes and modifications as fall within the scope of the appended claims.

What is claimed is:

1. A method for forming a via in a semiconductor device of a type that comprises a silicon substrate with an embedded first metal layer, said silicon substrate and said embedded first metal layer covered with a dielectric layer, and said dielectric layer covered with a resist mask having portions that form an aperture through said resist mask, said method comprising the steps of:
    applying a first vertical anisotropic dry etch process through said aperture in said resist mask to said dielectric layer;
    etching a via cavity through a top portion of said dielectric layer with said first vertical anisotropic dry etch process;
    applying an isotropic wet etch process through said aperture in said resist mask to sidewalls of said via; and
    etching a sloping surface in said sidewalls of said cavity with said isotropic wet etch process cavity wherein said isotropic wet etch process is applied to said sidewalls of said via cavity for a period of time selected so that an amount of said dielectric layer that is removed by a lateral portion of said isotropic wet etch process allows an application of a subsequent second vertical anisotropic dry etch process to create smooth sidewalls for said via cavity.

2. The method as set forth in claim 1 further comprising the step of:
    stopping said first vertical anisotropic dry etch process after said first vertical anisotropic dry etch process has etched said via cavity through approximately one half of said dielectric layer.

3. A method for forming a via in a semiconductor device of a type that comprises a silicon substrate with an embedded first metal layer, said silicon substrate and said embedded first metal layer covered with a dielectric layer, and said dielectric layer covered with a resist mask having portions that form an aperture through said resist mask, said method comprising the steps of:
    applying a first vertical anisotropic dry etch process through said aperture in said resist mask to said dielectric layer;
    etching a via cavity through a top portion of said dielectric layer with said first vertical anisotropic dry etch process;
    applying an isotropic wet etch process through said aperture in said resist mask to sidewalls of said via cavity;
    etching a sloping surface in said sidewalls of said cavity with said isotropic wet etch process;
    applying a second vertical anisotropic dry etch process through said aperture in said resist mask to said dielectric layer; and
    etching an extension of said via cavity through a bottom portion of said dielectric layer with said second vertical anisotropic dry etch process down to said first metal layer in said silicon substrate of said semiconductor device.

4. The method as set forth in claim 3 wherein said step of etching said extension of said via cavity creates sidewalls of said via cavity that have a smooth sloping surface with no concave surface in said sidewalls.

5. The method as set forth in claim 4 further comprising the steps of:
    removing said resist mask from said dielectric layer; and
    applying a conventional aluminum fill process to fill said via cavity.

6. The method as set forth in claim 4 wherein said via cavity has an aspect ratio greater than approximately one and two tenths.

7. The method as set forth in claim 4 wherein said dielectric layer comprises a layer of silicon dioxide.

8. The method as set forth in claim 4 wherein said dielectric layer has a thickness of at least ten thousand Angstroms.

9. A method for forming a via in a semiconductor device of a type that comprises a silicon substrate with an embedded first metal layer, said silicon substrate and said embedded first metal layer covered with a dielectric layer, and said dielectric layer covered with a resist mask having portions that form an aperture through said resist mask, said method comprising the steps of:
    applying a first vertical anisotropic dry etch process through said aperture in said resist mask to said dielectric layer;
    etching a via cavity through a top portion of said dielectric layer with said first vertical anisotropic dry etch process;
    applying an isotropic wet etch process through said aperture in said resist mask to sidewalls of said via cavity for a period of time selected so that an amount of said dielectric layer that is removed by a lateral portion of said isotropic wet etch process allows an application of a subsequent second vertical anisotropic dry etch process to create smooth sidewalls for said via cavity; and
    etching a sloping surface in said sidewalls of said cavity with said isotropic wet etch process.

10. The method as set forth in claim 9 further comprising the step of:
    stopping said first vertical anisotropic dry etch process after said first vertical anisotropic dry etch process has etched said via cavity through approximately one half of said dielectric layer.

11. The method as set forth in claim 9 further comprising the steps of:
    applying a second vertical anisotropic dry etch process through said aperture in said resist mask to said dielectric layer;
    etching an extension of said via cavity through a bottom portion of said dielectric layer with said second vertical anisotropic dry etch process down to said first metal layer in said silicon substrate of said semiconductor device.

12. The method as set forth in claim 11 wherein said step of etching said extension of said cavity creates sidewalls of said via cavity that have a smooth sloping surface with no concave surface in said sidewalls.

13. The method as set forth in claim 12 further comprising the steps of:
removing said resist mask from said dielectric layer; and
applying a conventional aluminum fill process to fill said via cavity.

14. The method as set forth in claim 13 wherein said via cavity has an aspect ratio greater than approximately one and two tenths.

15. The method as set forth in claim 13 wherein said dielectric layer comprises a layer of silicon dioxide.

16. The method as set forth in claim 13 wherein said dielectric layer has a thickness of at least ten thousand Angstroms.

17. A via cavity in a semiconductor device of a type that comprises a silicon substrate with an embedded first metal layer, said silicon substrate and said embedded first metal layer covered with a dielectric layer, and said dielectric layer covered with a resist mask having portions that form an aperture through said resist mask, said via cavity formed by the steps of:
applying a first vertical anisotropic dry etch process through said aperture in said resist mask to said dielectric layer to etch said via cavity through a top portion of said dielectric layer;
applying an isotropic wet etch process through said aperture in said resist mask to sidewalls of said via cavity to etch a sloping surface in said sidewalls of said cavity; and
applying a second vertical anisotropic dry etch process through said aperture in said resist mask to said dielectric layer to etch an extension of said via cavity through a bottom portion of said dielectric layer down to said first metal layer in said silicon substrate of said semiconductor device.

18. The via cavity as set forth in claim 17 formed by applying said isotropic wet etch process to said sidewalls of said via cavity for a period of time selected so that an amount of said dielectric layer that is removed by a lateral portion of said isotropic wet etch process allows an application of a subsequent second vertical anisotropic dry etch process to create smooth sidewalls for said via cavity.

19. The via cavity as set forth in claim 18 wherein said sidewalls of said via cavity have a smooth sloping surface with no concave surface in said sidewalls.

20. The via cavity as set forth in claim 19 wherein said via cavity has an aspect ratio greater than approximately one and two tenths.

* * * * *